United States Patent
Yonenaga et al.

(10) Patent No.: US 8,658,951 B2
(45) Date of Patent: Feb. 25, 2014

(54) HEAT TREATMENT APPARATUS

(75) Inventors: Tomihiro Yonenaga, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 189 days.

(21) Appl. No.: 13/092,650

(22) Filed: Apr. 22, 2011

(65) Prior Publication Data
US 2011/0248024 A1 Oct. 13, 2011

Related U.S. Application Data

(63) Continuation of application No. PCT/JP2009/061603, filed on Jun. 25, 2009.

(30) Foreign Application Priority Data

Oct. 23, 2008 (JP) ................................ 2008-272781

(51) Int. Cl.
H05B 6/10 (2006.01)
(52) U.S. Cl.
USPC ........................................ 219/634; 438/758
(58) Field of Classification Search
USPC ......... 219/634, 647, 672, 600, 635, 661, 615, 219/535
See application file for complete search history.

(56) References Cited

U.S. PATENT DOCUMENTS

| 4,579,080 | A * | 4/1986 | Martin et al. | 118/500 |
| 6,137,985 | A * | 10/2000 | Kinouchi et al. | 399/329 |
| 6,316,754 | B1 | 11/2001 | Schatz et al. | |
| 6,649,887 | B2 * | 11/2003 | Budinger | 219/615 |
| 2003/0160045 | A1 * | 8/2003 | Eberhardt et al. | 219/634 |
| 2003/0192878 | A1 * | 10/2003 | Anderhuber et al. | 219/600 |
| 2007/0167026 | A1 * | 7/2007 | Miura | 438/758 |
| 2008/0203088 | A1 * | 8/2008 | Kinouchi et al. | 219/619 |

FOREIGN PATENT DOCUMENTS

| JP | 56-6428 | 1/1981 |
| JP | 61-91920 | 5/1986 |
| JP | 3-22524 | 1/1991 |
| JP | 10-12364 | 1/1998 |
| JP | 2001-509634 | 7/2001 |
| JP | 2003-17426 | 1/2003 |
| JP | 2003-68658 | 3/2003 |
| JP | 2005-136095 | 5/2005 |

OTHER PUBLICATIONS

Japanese International Search Report mailed Jul. 21, 2009 in PCT/JP2009/061603 filed Jun. 25, 2009 with English Translation.

* cited by examiner

*Primary Examiner* — Henry Yuen
*Assistant Examiner* — Phuong Nguyen
(74) *Attorney, Agent, or Firm* — Rothwell, Figg, Ernst & Manbeck, P.C.

(57) ABSTRACT

In-plane temperature of each substrate is uniformly controlled at the time of heating substrates placed on a plurality of susceptors, respectively. A heat treatment apparatus is provided with susceptors, i.e., conductive members for placing wafers thereon, having an induction heating body electrically divided into a center portion thereof and a peripheral portion thereof; a quartz boat supporting the susceptors arranged in a row; an induction coil, which is arranged inside a processing chamber to surround the circumference of each of the susceptors and configured such that the temperature of the induction coil can be freely adjusted; and a control unit which performs temperature control by changing the ratio between heat value at the center portion of the induction heating body and that at the peripheral portion, by controlling two high frequency currents of different frequencies to be applied to the induction coil from a high frequency current circuit.

14 Claims, 12 Drawing Sheets

CURRENT OF FIRST HIGH FREQUENCY (1KHz) ON
CURRENT OF SECOND HIGH FREQUENCY (100 KHz) ON
INTENSITY RATIO (1 KHz / 100 KHz) IS LARGE

CURRENT OF FIRST HIGH FREQUENCY (1KHz) ON
CURRENT OF SECOND HIGH FREQUENCY (100 KHz) ON
INTENSITY RATIO (1 KHz / 100 KHz) IS SMALL

CURRENT OF FIRST HIGH FREQUENCY (1KHz) ON
CURRENT OF SECOND HIGH FREQUENCY (100 KHz) OFF

HEAT TREATMENT APPARATUS

This application is a Continuation Application of PCT International Application No. PCT/JP2009/061603 filed on Jun. 25, 2009, which designated the United States.

FIELD OF THE INVENTION

The present invention relates to a heat treatment apparatus for performing a predetermined heat treatment on a substrate, e.g., a semiconductor wafer, a glass substrate or the like.

BACKGROUND OF THE INVENTION

In order to manufacture a semiconductor integrated circuit, various heat treatments such as a film forming process for forming, e.g., a silicon film or a silicon oxide film, an oxidation process and the like are performed on a substrate surface. When the heat treatments are carried out, there is often used a so-called batch type heat treatment apparatus capable of simultaneously processing a plurality of semiconductor wafers (hereinafter, simply referred to as "wafers").

The batch type heat treatment apparatus employs a method for heating a reaction tube in which a plurality of wafers is accommodated by using an electric furnace (hot wall). However, the method using an electric furnace is disadvantageous in that a long period of time is required to increase or decrease a wafer temperature due to large heat capacity of the entire furnace to thereby decrease productivity remarkably.

In addition, there is known a heat treatment apparatus for heating a wafer through high-frequency induction heating (see, e.g., Japanese Patent Applications Publication Nos. S56-006428 and S61-091920). This heat treatment apparatus generally includes an induction coil externally wound around a reaction tube and supplies a high frequency current to the induction coil, to thereby inductively heat a conductive susceptor provided in the reaction tube. Accordingly, a wafer mounted on the susceptor is indirectly heated by the heat conduction. Since, with such configuration, it becomes unnecessary to directly heat the reaction tube, the heat capacity of the susceptor can be reduced and the wafer temperature can be increased or decreased at a high speed compared to the case of using an electric furnace. Further, it is possible to control a wall temperature of the reaction tube separately from the wafer temperature as in a so-called cold wall type heat treatment apparatus.

However, if the high frequency induction heating is performed in the cold wall type heat treatment apparatus having a plurality of susceptors of small heat capacity, in-plane temperature uniformity of the susceptors and/or temperature uniformity between the susceptors are deteriorated due to a difference between temperatures of the susceptors and an ambient temperature (e.g., temperatures of inner walls of the reaction tube and the like). Furthermore, temperature uniformity between a plurality of wafers and in-plane temperature uniformity of each wafer may be deteriorated.

As for a method for improving temperature uniformity between wafers, there is disclosed in, e.g., Japanese Patent Application Publication No. 2003-017426 for controlling temperature uniformity between wafers by individually controlling powers supplied to a plurality of induction coils arranged in a lengthwise direction of the reaction tube. Moreover, in, e.g., Japanese Patent Application Publication No. 2003-068658, wafers are arranged between inductively heated dummy heating plates to improve the temperature uniformity.

However, no prior art has disclosed a method for controlling temperature uniformity of each wafer, and there has not yet been known a method for controlling in-plane temperature uniformity in wafers which can be applied to a batch type heat treatment apparatus for processing a plurality of wafers simultaneously.

SUMMARY OF THE INVENTION

In view of the above, the present invention provides a heat treatment apparatus which can control in-plane temperatures of substrates when the substrates mounted on a plurality of susceptors are heated at the same time.

In accordance with an aspect of the present invention, there is provided a heat treatment apparatus for performing a heat treatment on a plurality of substrates by supplying a gas into a depressurizable processing chamber. The heat treatment apparatus includes a plurality of susceptors as conductive members for mounting thereon the substrates, each of which has an induction heating body divided into a central portion and a peripheral portion; a susceptor supporting unit for supporting the susceptors spaced from each other at a regular interval in a row; an induction coil which is arranged inside the processing chamber to surround a circumference of each of the susceptors, a temperature of the induction coil being controllable; a high frequency current circuit for applying two high frequency currents of different frequencies to the induction coil; and a control unit for performing temperature control by changing a ratio between a heat value at the central portion of the induction heating body and a heat value at the peripheral portion thereof by controlling the two high frequency currents of different frequencies to be applied from the high frequency current circuit to the induction coil.

In accordance with the aspect of the present invention, the heat treatment is performed on the substrates while controlling the temperatures of the substrates. To do so, the induction heating bodies of the susceptors are heated by applying predetermined high frequency currents from the high frequency current circuit to the induction coil while controlling the temperature of the induction coil to be set at a proper level. Accordingly, since the induction coil is provided inside the processing chamber unlike a conventional case in which the induction coil is provided at the outer portion of the sidewall, the sidewall can be formed of, e.g., a conductive material such as a metal without being limited to an insulating material which is not affected by the electromagnetic induction.

Further, the diameter of the induction coil can be reduced in accordance with the diameter of the susceptor without being limited by the size of the sidewall of the processing chamber. Thus, the amount of magnetic fluxes passing through the susceptors can be increased, which results in improvement in the heating efficiency of the susceptor. Moreover, the temperature of the induction coil can be prevented from being excessively increased by heat from the susceptors by controlling the temperature of the induction coil provided at the inner portion of the sidewall of the processing chamber to be kept at a proper level lower than the temperature of the susceptor. Accordingly, breakage of the induction coil can be avoided.

Furthermore, when a film forming process is performed by introducing a film forming gas into the processing chamber, it is possible to suppress thermal decomposition of the film forming gas on the surface of the induction coil and deposition of unnecessary deposits onto the surface of the induction coil.

The control unit performs temperature control by changing a ratio between a heat value at the central portion of the induction heating body and that at the peripheral portion thereof by controlling the two high frequency currents of different frequencies applied from the high frequency current circuit to the induction coil. Specifically, the control unit performs the temperature control by superposedly or sequentially applying the two high frequency currents of different frequencies from the high frequency current circuit to the induction coil. Hence, the induction heating can be performed while changing the ratio between the heat value at the central portion of the induction heating body and that at the peripheral portion thereof. Therefore, even if the temperatures of members (e.g., the induction coil, the sidewall of the processing chamber or the like) adjacent to the susceptors are lower than those of the susceptors, it is possible to supply heat mainly to the peripheral portions of the susceptors where heat is easily lost, while heating the central portion thereof, by controlling the intensity ratio or switching time of the two currents of different frequencies applied to the induction coil. As a result, the heating efficiency of the susceptors can be improved, and the distribution of in-plane temperatures in the susceptors can be controlled.

Moreover, the sidewall of the processing chamber may be made of a metal such as aluminum or an aluminum alloy, and the apparatus may further include: a wall temperature control mechanism for controlling the temperature of the sidewall independently of temperatures of the susceptors. When the sidewall of the processing chamber is made of a conductive material, heat is produced in the sidewall by the high frequency magnetic field generated in the processing chamber. However, if the resistivity of the material of the sidewall is considerably lower than that of the material of the induction heating body included in the susceptor, the heat value by the induced current produced at the sidewall is reduced to a negligible level. For that reason, the sidewall of the processing chamber is made of aluminum or an aluminum alloy, which enables the temperature of the sidewall of the processing chamber to be controlled independently of the temperatures of the susceptors by the wall temperature control mechanism.

For example, the temperature of the sidewall of the processing chamber may be set to be lower than at least the temperatures of the susceptors. Since the temperature of the sidewall of the processing chamber can be controlled independently of the temperatures of the susceptors, even if the susceptors are heated to a higher temperature, the temperature of the sidewall of the processing chamber can be maintained at a desired level lower than the temperatures of the susceptors. Thus, when the film forming process is performed by introducing the film forming gas into the processing chamber, it is possible to suppress the thermal decomposition of the film forming gas on the surface of the sidewall of the processing chamber and the deposition of unnecessary deposits onto the sidewall of the processing chamber.

The sidewall of the processing chamber is made of a metal as described above and thus can function as a magnetic shield for preventing the high frequency magnetic fluxes from leaking to the outside. Therefore, it is unnecessary to provide the magnetic shield at the outer portion of the sidewall of the processing chamber unlike the conventional case in which the induction coil is provided at the outer portion of the sidewall of the processing chamber. As a consequence, the heat treatment apparatus can be scaled down.

The induction coil may be formed as a metal pipe, and the apparatus may further include a coil temperature control mechanism for controlling the temperature of the induction coil by circulating a temperature control medium in the metal pipe. In this case, the temperature of the induction coil may be preferably set to be equal to the temperature of the sidewall of the processing chamber. Accordingly, the temperature of the induction coil can be maintained at a desired level lower than the temperatures of the susceptors.

One of the two frequencies may be set within a range from about 0.5 kHz to 2 kHz and the other may be set within a range from about 50 kHz to 200 kHz by the high frequency current circuit. In this case, a relatively higher frequency of the two frequencies and the width of the peripheral portion of the induction heating body may be preferably set to inductively heat only the peripheral portion of the induction heating body by the current of the relatively higher frequency. In this way, when the current of the higher frequency is applied, only the peripheral portion of the induction heating body is heated due to the skin effect of the induced current. Therefore, it is possible to independently heat the peripheral portion of the induction heating body as compared with the heat value distributed throughout the entire surface of the induction heating body when the current of the lower frequency is applied. Hence, the ratio between the heat value at the peripheral portion of the induction heating body and that at the central portion thereof can be controlled by controlling the intensity ratio of the two currents of different frequencies.

A groove may be formed at the central portion of the induction heating body such that the groove extends from an edge of the induction heating body to a center thereof. Accordingly, the induced current generated at the central portion of the induction heating body by applying the current of the lower frequency flows near the center along the groove. Thus, the center of the induction heating body can also be heated.

The induction heating body may be made of one or more materials selected among graphite, glassy carbon and SiC. If the resistivity of the material of the sidewall of the processing chamber is considerably smaller than that of the material of the induction heating body, it is possible to selectively heat the susceptors by the induced current produced by the high frequency magnetic field in the processing chamber while hardly heating the sidewall of the processing chamber.

In accordance with the present invention, the susceptors can be selectively heated while suppressing the sidewall of the processing chamber from being heated. Further, heat can be effectively supplied mainly to the peripheral portion of the susceptor where heat is easily lost due to the temperature difference between the susceptors and the sidewall and, also, the distribution of in-plane temperatures of the susceptors can be controlled.

DETAILED DESCRIPTION OF THE EMBODIMENTS

Figure 1:
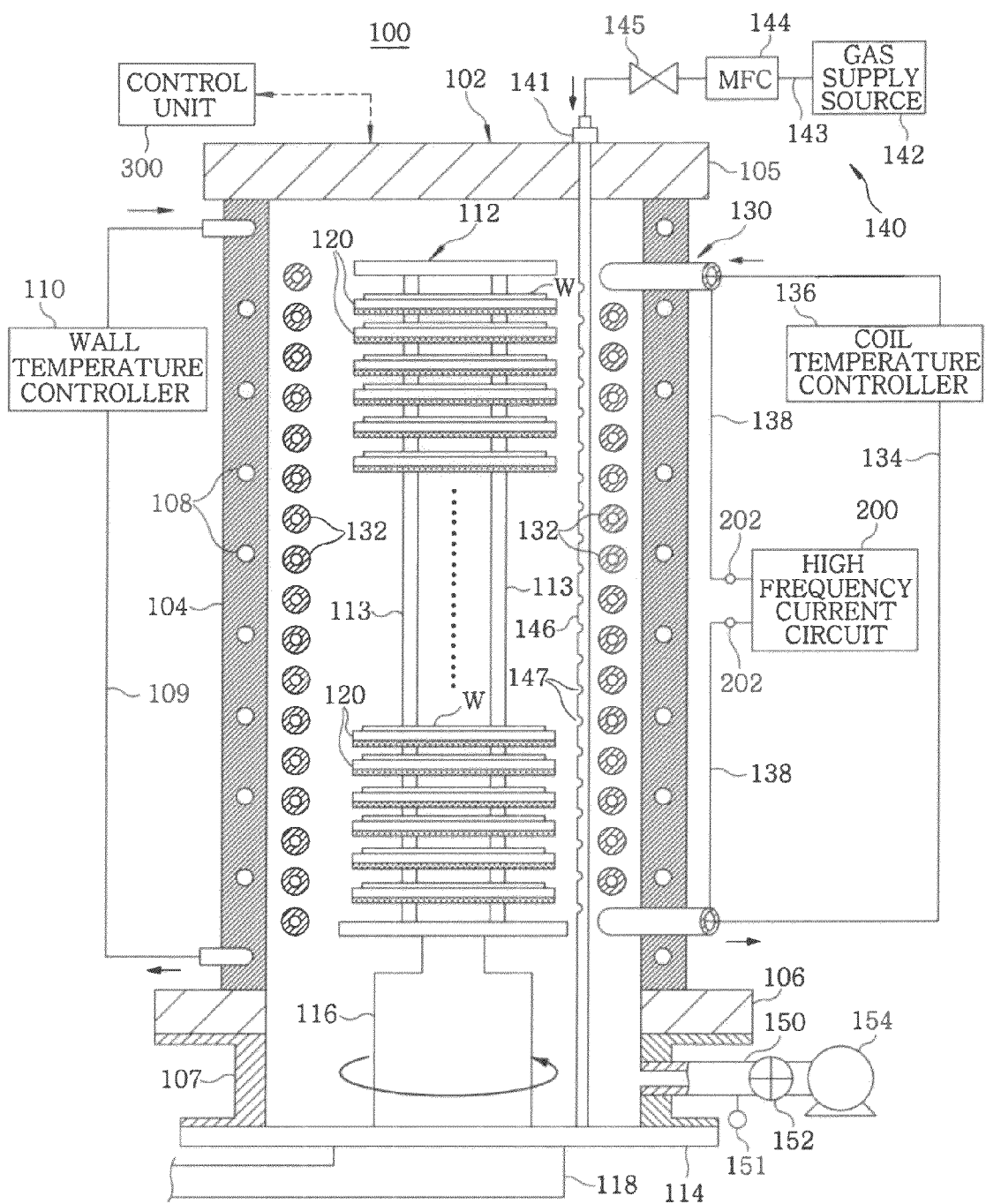
FIG. 1 is a cross sectional view showing a schematic configuration of a heat treatment apparatus in accordance with an embodiment of the present invention.

The embodiments of the present invention will be described with reference to the accompanying drawings which form a part hereof. Throughout this specification and the drawings, like reference numerals designate like parts having substantially identical functions, and redundant description thereof will be omitted.

(Configuration Example of Substrate Processing Apparatus)

First, a substrate processing apparatus in accordance with an embodiment of the present invention will be described. Here, a batch type vertical heat treatment apparatus capable of performing a heat treatment on a plurality of substrates to be processed, e.g., semiconductor wafers (hereinafter, simply referred to as "wafers") simultaneously will be described as an example. FIG. 1 is a cross sectional view showing a configuration example of the heat treatment apparatus.

As illustrated in FIG. 1, a heat treatment apparatus 100 includes an airtight cylindrical processing chamber 102 which is extended in a vertical direction and has an open lower end. A quartz boat 112 serving as a susceptor supporting unit for supporting a plurality of susceptors 120 each of which mounts thereon a wafer W is inserted into the processing chamber 102 through the open lower end thereof so as to be movable in a vertical direction.

The processing chamber 102 has a cylindrical reaction tube 104 made of a metal, a circular plate-shaped upper flange 105 provided to an upper end of the reaction tube 104, and a cylindrical manifold 107 connected to the reaction tube 104 via an annular lower flange 106.

A lower opening of the manifold 107, i.e., the lower opening of the processing chamber 102, is closed airtightly by a cover 114. The quartz boat 112 is provided above the cover 114, and a lower portion of the cover 114 is supported by a boat elevator 118. Thus, the quartz boat 112 can be loaded into and unloaded from the processing chamber 102, i.e., the reaction tube 104, through the lower opening thereof by vertically moving the quartz boat 112 and the cover 114 by the boat elevator 118. When the cover 114 is at its upper limit position, for example, the quartz boat 112 is set inside the processing chamber 102 and the opening end of the manifold 107 is closed by the cover 114.

In the quartz boat 112, a plurality of susceptors 120 each of which mounts thereon a wafer W are arranged in a shelf shape to be spaced apart from each other in a direction (vertical direction in the present embodiment) perpendicular to the horizontal mounting surfaces (top surfaces). Each of the susceptors 120 is supported by a plurality of supports 113 (e.g., three in the present embodiment). A single wafer W is mounted on a mounting surface of each susceptor 120. Moreover, each of the susceptors 120 of the present embodiment is formed by coupling an induction heating body 122 as a conductive member on an insulating plate 123. The induction heating body 122 is made of, e.g., a conductive material such as graphite, glassy carbon, SiC or the like. The wafer W is mounted on the top surface of the induction heating body 122. A detailed configuration of the susceptor will be described later.

The quartz boat 112 rotates together with the susceptors 120 on which the wafers W are mounted. To be specific, the quartz boat 112 is supported via a cylindrical heat insulating member 116 on the cover 114 so as to be rotatable about a vertical axis. The susceptors 120 on which the wafers W are mounted can be rotated about the vertical axis by rotating the quartz boat 112 with, e.g., motor (not shown) connected to a lower portion of the insulating member 116.

Further, unprocessed wafers W are accommodated in a cassette container (not shown). In order to process the wafers W, the wafers W are transferred from the cassette container to the susceptors 120 by a transfer unit (not shown) in a state where the quartz boat 112 is unloaded from the reaction tube 104 downwardly. After the wafers W are transferred, the quartz boat 112 is loaded into the reaction tube 104 by the boat elevator 118 so that a heat treatment can be performed on the wafers W. Upon completion of the processing of the wafers W, the quartz boat 112 is unloaded from the reaction tube 104 by the boat elevator 118, and the wafers W on the susceptors 120 are returned to the cassette container by the transfer unit.

An induction coil 130 of which temperature is controllable is provided around the quartz boat 112 so as to surround the susceptors 120. In the present embodiment, the induction coil 130 is provided inside the sidewall of the reaction tube 104 (the sidewall of the processing chamber 102) and thus can be positioned close to the susceptors 120. Accordingly, it is possible to improve the heating efficiency of the susceptors 120 and prevent the induction coil 130 from being heated to be broken by heat from the susceptors by controlling the temperature of the induction coil 130.

A coil temperature control mechanism is provided to control the temperature of the induction coil 130 in accordance with the present embodiment. The coil temperature control mechanism has a configuration to be described below, for example. First, the induction coil 130 is formed as a pipe 132 made of, e.g., a metal such as aluminum or the like. The temperature of the induction coil 130 can be maintained by circulating in the pipe 132 a temperature control medium such as water, fluorine-based nonreactive liquid (e.g., Galden (registered trademark), Fluorinert (registered trademark)) or the like. To be specific, the pipe 132 forming the induction coil 130 is arranged inside of the reaction tube 104 such that it extends helically from the top to the bottom of the reaction tube 104. The induction coil 130 is connected to a coil temperature controller 136 for controlling a temperature of the temperature control medium circulating in the pipe 132 to be maintained at a predetermined level, thereby forming a circulation path 134.

The temperature of the induction coil 130 can be controlled to be maintained at a predetermined level by circulating in the pipe 132 the temperature control medium having a temperature controlled to be kept at a predetermined level by the coil temperature controller 136. Preferably, the temperature of the induction coil 130 is set to be lower than those of the susceptors 120. In the case of the film forming process, for example, the temperature of the induction coil 130 is set to such a level that thermal decomposition of a film forming gas and deposition of unnecessary deposits onto the surface of the induction coil 130 can be prevented.

In accordance with the induction coil 130 described above, the induction coil 130 can be prevented from being heated by the susceptors 120 heated to a high temperature. Therefore, the deposition of deposits onto the surface of the induction coil 130 can be suppressed, and breakage of the induction coil 130 by excessive heat can be avoided.

Moreover, the upper and the lower end of the induction coil 130 are connected to output terminals 202 of a high frequency current circuit 200 through power supply lines 138. By applying a high frequency current from the high frequency current circuit 200 to the induction coil 130, a high frequency magnetic field is generated in the reaction tube 104. Magnetic fluxes (high frequency magnetic fluxes) produced by the high frequency magnetic field pass through the susceptors 120 supported by the quartz boat 112, so that an induced current is produced at the induction heating bodies 122 included in the susceptors 120. Accordingly, heat is emitted from the induction heating bodies 122, thereby heating the susceptors 120. In the case of the film forming process, for example, the temperatures of the susceptors 120 are controlled to be maintained within a range from, e.g., about 300° C. to 700° C.

The high frequency current circuit 200 of the present embodiment is configured to apply two high frequency currents of different frequencies (higher frequency and lower frequency) to the induction coil 130 superposedly or separately in order to control the distribution of in-plane temperatures in the susceptors 120 by using the skin effect of the induced current. The skin effect refers to the phenomenon in which the induced current generated by electromagnetic induction becomes increased to a maximum around the peripheral portions of the induction heating bodies 122 included in the susceptors 120 and is becoming further decreased sharply as getting closer to the central portion thereof. At this time, the decreased amount (current penetration depth) is varied in accordance with the frequencies. A configuration example of the high frequency current circuit 200 will be described later.

As described above, since the induction coil 130 is disposed inside the reaction tube 104 in the present embodiment, the material of the sidewall of the reaction tube 104 is not limited to an insulating material which does not affect the electromagnetic induction caused by the induction coil 130. Hence, the sidewall of the reaction tube 104 can be made of a conductive material, e.g., a metal having a low resistivity such as aluminum or the like.

Further, the high frequency magnetic fluxes produced in the reaction tube 104 by the induction coil 130 of the present embodiment pass through the susceptors 120, and some of the magnetic fluxes reach the sidewall of the reaction tube 104. Therefore, if the sidewall of the reaction tube 104 is made of metal having a relatively high resistivity (e.g., iron, stainless steel or the like), heat is generated in the sidewall of the reaction tube 104 by the high frequency magnetic fluxes. When the heat is generated in the sidewall of the reaction tube 104, it is difficult to control the sidewall temperature of the reaction tube 104 by using another heating unit independently of the susceptor temperature.

The heat generation rate (heat value) of the conductive material that is heated by the induction heating is in proportion to a square root of the resistivity of the conductive material. Thus, even if the magnetic fluxes are same, the heat generation rate by the induction heating increases as the resistivity of the conductive material increases, and decreases as the resistivity of the conductive material decreases. Accordingly, the heat generation rate caused by the induction heating can be controlled by properly selecting the conductive material.

In the present embodiment, it is possible to selectively inductively heat the susceptors 120 while hardly heating the sidewall of the reaction tube 104 by selecting the materials of the induction heating bodies 122 and the sidewall of the reaction tube 104 such that the resistivity of the induction heating bodies 122 included in the susceptors 120 is greater than that of the sidewall of the reaction tube 104. Preferably, the induction heating bodies 122 included in the susceptors 120 are made of a conductive material having a high resistivity, e.g., graphite, glassy carbon, SiC or the like, and the sidewall of the reaction tube 104 is made of a metal having a considerably low resistivity, e.g., aluminum, an aluminum alloy or the like. In this way, the sidewall of the reaction tube 104 can be prevented from being heated by the magnetic fluxes produced in the reaction tube 104, which enables the sidewall temperature to be controlled independently of the susceptor temperature.

In view of the above, the heat treatment apparatus 100 can be configured as a so-called cold wall type film forming apparatus. When a film forming process is performed on a wafer W in a conventionally configured hot wall type film forming apparatus by supplying a film forming gas into the reaction chamber, the temperature of the sidewall of the reaction tube increases. Therefore, the film forming gas may be thermally decomposed near the sidewall and, thus, a large amount of deposits may be deposited onto the sidewall. Accordingly, the amount of the film forming gas which reaches the wafer W may be varied, resulting in an unstable film formation on the wafer. Further, the deposits accumulated on the sidewall of the reaction tube may be peeled off, thereby generating particles.

On the other hand, the heat treatment apparatus 100 of the present embodiment is configured as the cold wall type film forming apparatus as described above such that the sidewall temperature of the reaction tube 104 can be controlled independently of the wafer temperature. Accordingly, it is possible to prevent the thermal decomposition of the source gas near the sidewall of the reaction tube 104 and thus considerably reduce the amount of deposits deposited onto the sidewall of the reaction tube 104.

In the present embodiment, the sidewall of the reaction tube 104 is made of a metal as described above and thus can function as a magnetic shield for preventing the high frequency magnetic flux from leaking to the outside. Therefore, it is unnecessary to provide the magnetic shield outside the sidewall of the processing chamber unlike the conventional case in which the induction coil is provided outside of the sidewall of the processing chamber. As a consequence, the heat treatment apparatus 100 can be scaled down.

A wall temperature control mechanism for directly controlling a temperature of the sidewall is installed at the sidewall of the reaction tube 104. The wall temperature control mechanism is configured as will be described below, for example. Specifically, a temperature control medium path 108 through which a temperature control medium such as water, brine or the like passes is formed at the sidewall of the reaction tube 104. Further, the temperature control medium path 108 is connected to a wall temperature controller 110 for controlling a temperature of the temperature control medium to be maintained at a predetermined level, thereby forming a circulation path 109.

In this way, the sidewall temperature of the reaction tube 104 can be controlled to be maintained at a predetermined level by circulating in the temperature control medium path 108 the temperature control medium having a temperature controlled to be kept at a predetermined level by the wall temperature controller 110. Preferably, the sidewall temperature of the reaction tube 104 is set to be lower than the temperatures of the susceptors 120. In the case of the film forming process, for example, the sidewall temperature of the reaction tube 104 is set to such a level that thermal decomposition of a film forming gas and deposition of unnecessary deposits onto the sidewall can be prevented. As a result, it is possible to effectively prevent the film formation from being unstably performed by variations in the amount of film forming gas that reaches the wafer W or deposits from being peeled off from the wall of the reaction tube to thereby suppress the generation of particles.

Since the sidewall temperature of the reaction tube 104 can be controlled independently of the temperatures of the susceptors 120 as described above, even if the susceptors 120 are heated to a higher temperature, the temperature of the sidewall can be maintained at a desired level that is lower than those of the susceptors 120. Preferably, the temperature of the sidewall of the reaction tube 104 is set to be equal to that of the induction coil 130.

As shown in FIG. 1, for example, the temperature control medium path 108 is formed in a helical shape along the sidewall of the reaction tube 104 from its upper portion to its lower portion, so that the entire sidewall can be uniformly cooled. The configuration of the wall temperature control mechanism is not limited to that shown in FIG. 1. When the sidewall of the reaction tube 104 is made of a metal having a high thermal conductivity, e.g., aluminum or the like, it is unnecessary to uniformly cool the entire sidewall and, hence, the configuration of the wall temperature control mechanism can be simplified.

The heat treatment apparatus 100 has a gas supply unit 140 for supplying a film forming gas, e.g., $TiCl_4$, $SiH_2Cl_2$, $NH_3$, $N_2$ gas, $O_2$ gas or the like, into the reaction tube 104. To be specific, the gas supply unit 140 has the configuration illustrated in FIG. 1, for example. In other words, a gas inlet 141 is formed at the upper flange 105, and a gas supply source 142 is connected to the gas inlet 141 via a gas supply line 143.

The gas supply line 143 is provided with a mass flow controller (MFC) 144 for controlling a gas flow rate and an opening/closing valve 145. Further, the configuration of the gas supply unit 140 is not limited to that shown in FIG. 1. For example, two or more gas supply lines may be provided so that two or more gases can be supplied independently.

The gas inlet 141 is connected to a rod-shaped gas nozzle 146 extending vertically near the outside of the susceptors 120. The gas nozzle 146 has small gas supply holes 147 formed to face the spaces between the uppermost susceptor 120 and the lowermost susceptor 120.

Figure 2:
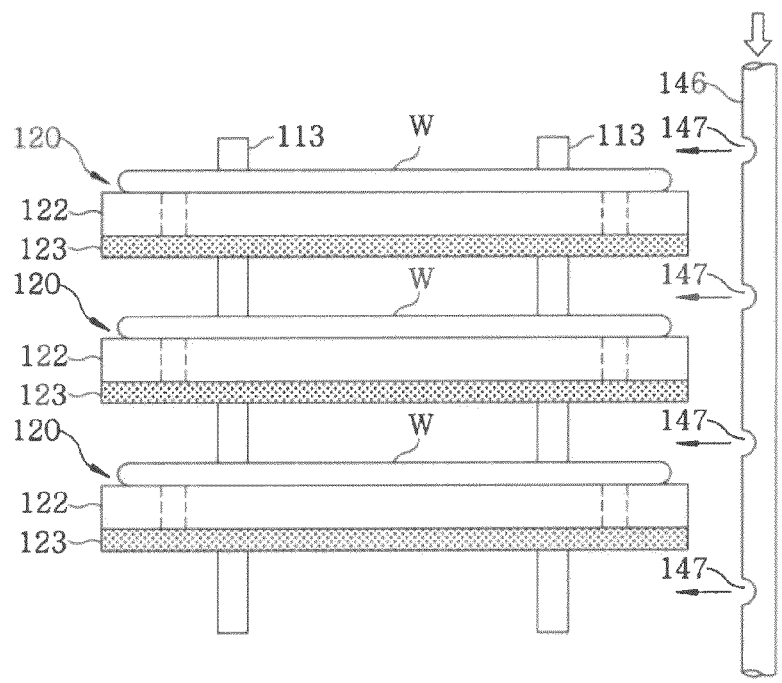
FIG. 2 provides a fragmentary enlarged view for explaining a positional relationship between a gas nozzle and susceptors shown in FIG. 1.

Preferably, the gas supply holes 147 are formed toward the central direction of the susceptors 120 so that the gas can be supplied between the susceptors 120. Accordingly, the processing gas is supplied onto the wafers W mounted on the susceptors 120, as can be seen from FIG. 2. Further, the gas nozzle 146 is configured to be rotatable within a predetermined angle range by a motor and, thus, the orientations of the gas supply holes 147 may be changed regularly.

The manifold 107 is connected to a gas exhaust mechanism such as a vacuum pump 154 or the like through a gas exhaust line 150 through which the gas in the reaction tube 104 is exhausted. For example, a pressure control unit 152 for controlling a pressure in the reaction tube 104 is provided at the gas exhaust line 150. The pressure control unit 152 has, e.g., a combination valve, a butterfly valve, a valve driving unit and the like.

In addition, the gas exhaust line 150 is provided with a pressure sensor 151 for feedback-controlling the pressure control unit 152 by detecting the pressure in the processing chamber 102. As for the pressure sensor 151, it is preferable to use an absolute pressure type capacitive vacuum gauge (capacitance manometer) or the like which is hardly affected by variations in an external pressure.

Each unit of the heat treatment apparatus 100 is controlled by a control unit 300. The control unit 300 controls each unit based on process recipe data including processing conditions such as a set pressure, a set temperature of a heater, a gas flow rate and the like in accordance with a type of a thin film to be formed, a film thickness thereof and the like, for example. Moreover, the control unit 300 receives pressure detection signals from, e.g., the pressure sensor 151, and controls each unit of the heat treatment apparatus 100 based on the detection signals.

(Configuration Example of Control Unit)

Figure 3:
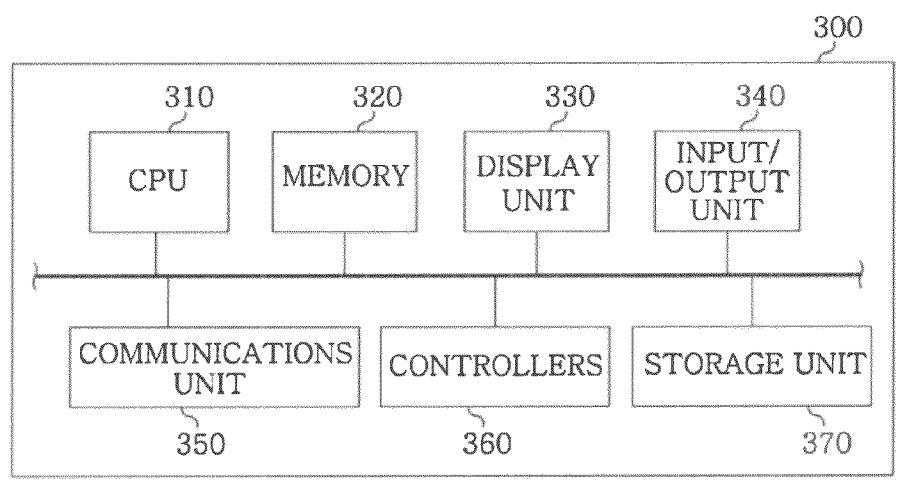
FIG. 3 offers a block diagram describing a configuration example of a control unit shown in FIG. 1.

A configuration example of the control unit 300 will be described with reference to FIG. 3. FIG. 3 is a block diagram showing a configuration example of the control unit 300. As illustrated in FIG. 3, for example, the control unit 300 includes a CPU (central processing unit) 310; a memory 320 used for various processes of the CPU 310; a display unit 330 including a liquid crystal display or the like for displaying a manipulation screen, a selection screen or the like; an input/output unit 340 including an operation panel, a keyboard or the like used by an operator to perform various operations, such as inputting of various data, outputting of various data to a predetermined storage medium and the like; and a communications unit 350 for exchanging data through a network or the like.

In addition, the control unit 300 includes various controllers 360 for controlling respective units of the heat treatment apparatus 100, a storage unit 370 formed of a hard disk drive (HDD) or the like for storing various programs executed by the CPU 310 or data required to execute the programs and the like. The CPU 310 reads out the programs or the data from the storage unit 370 when necessary.

Various controllers 360 control the wall temperature controller 110, a coil temperature controller 136, each unit of the high frequency current circuit 200, the vacuum pump 154 and the like. The storage unit 370 stores therein recipe data (processing condition data) including, e.g., a pressure in the processing chamber, a temperature of the susceptor 120, a sidewall temperature of the reaction tube 104, a gas flow rate and the like. The control unit 300 reads out a required recipe from the storage unit 370 and executes a predetermined program, thereby performing a processing on the wafer W.

In the heat treatment apparatus 100 configured as described above, when the film forming process is performed on each of the wafers W in the reaction tube 104, the control unit 300 inductively heats the susceptors 120 by applying the high frequency current from the high frequency current circuit 200 to the induction coil 130 to heat the susceptors 120 all together while controlling the coil temperature controller 136 to adjust the temperature of the induction coil 130. At this time, the susceptors 120 are heated to a temperature ranging from, e.g., about 300° C. to 700° C. Moreover, the wafers W are heated while being rotated together with the susceptors 120 by the quartz boat 112 in the reaction tube 104, so that the wafers W can be heated uniformly in the circumferential direction.

Further, the pressure in the reaction tube 104 is reduced to a predetermined vacuum level by exhausting the reaction tube 104 by the vacuum pump 154, and the film forming gas is introduced from the gas supply unit 140 into the reaction tube 104. Accordingly, a desired thin film is formed on each of the wafers W. At that time, the sidewall temperature is controlled to be maintained at a predetermined level by circulating the temperature control medium in the temperature control medium path 108 formed along the sidewall of the reaction tube 104 by the wall temperature controller 110.

As described above, in accordance with the heat treatment apparatus 100 of the present embodiment, the induction coil 130 is provided inside the sidewall of the reaction tube 104 (the sidewall of the processing chamber 102) so as to be positioned close to the susceptors 120. Therefore, without increasing the current applied to the induction coil 130, it is possible to increase the magnetic fluxes passing through the susceptors 120 correspondingly to the amount of the reduction in the diameter of the induction coil 130. As a result, the heating efficiency of the susceptors 120 can be improved.

Besides, the temperature of the induction coil 130 provided inside the sidewall of the reaction tube 104 or the temperature of the sidewall of the reaction tube 104 can be controlled to be kept lower than the temperatures of the susceptors 120. Hence, the deposition of unnecessary deposits onto the surface of the induction coil 130 can be suppressed.

As described above, the sidewall of the processing chamber 102 is made of a metal and thus can function as a magnetic shield for preventing the high frequency magnetic flux from leaking to the outside. Therefore, it is unnecessary to provide the magnetic shield outside the sidewall of the processing chamber unlike the conventional case in which the induction coil is provided outside the sidewall of the processing chamber. As a result, the heat treatment apparatus 100 can be scaled down.

Although the susceptors 120 have a high temperature, e.g., about 500° C. or above, the sidewall of the reaction tube 104 or the induction coil 130 has a low temperature, e.g., about 150° C. or below. Thus, the differences between the temperatures of the susceptors 120 and those of members adjacent thereto (e.g., the sidewall, the induction coil 130 and the like) increase remarkably. Hence, the heat discharge in the peripheral portions of the susceptors 120 is increased significantly as compared with that of the central portion thereof, and the heat becomes more easily lost(taken) from the peripheral portion of the susceptor 120. For that reason, the inherent problems of the cold wall type apparatus come to the fore, in which the in-plane temperature uniformity in the susceptors 120 and those of the wafers mounted on the susceptors 120 deteriorate.

Figure 4:
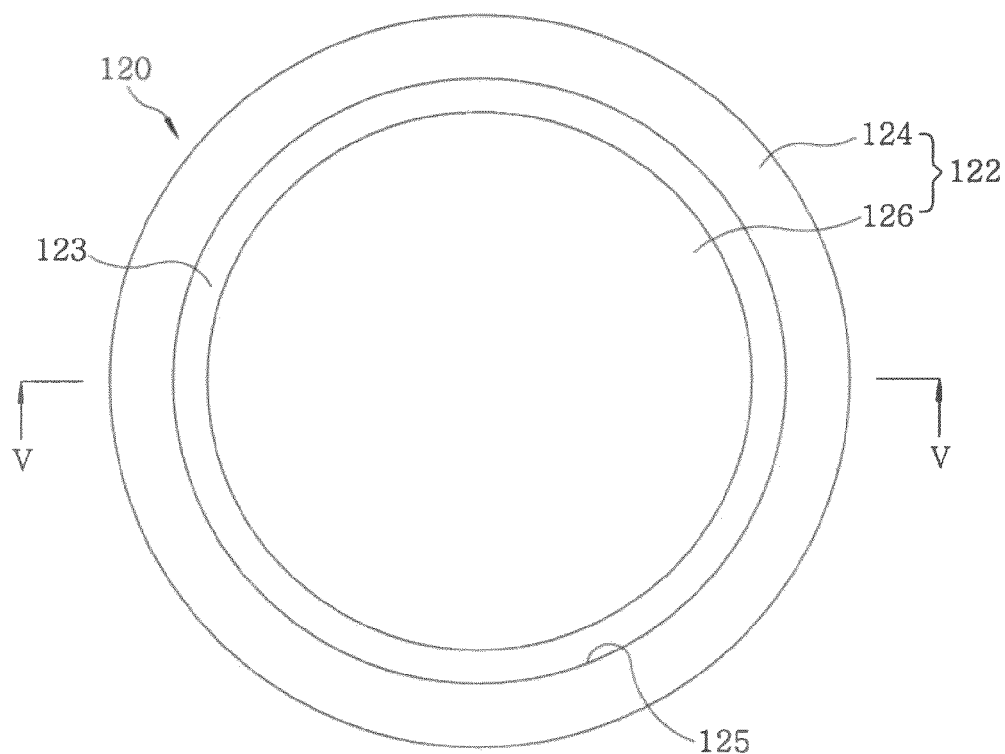
FIG. 4 presents a top view depicting a configuration of a susceptor of this embodiment as seen from the top.
Figure 5:
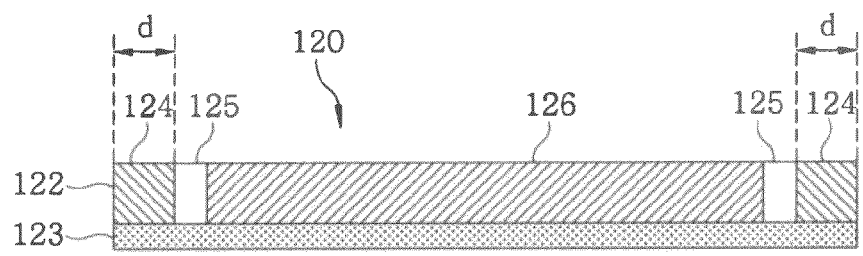
FIG. 5 represents a cross sectional view of the susceptor which is taken along the line V-V of FIG. 4.

However, the heat treatment apparatus 100 of the present embodiment can accurately control the distribution of in-plane temperatures in the wafers by adjusting the distribution of in-plane temperatures in the susceptors 120. To be specific, each of the induction heating bodies 122 included in the susceptors 120 is divided into a central portion1 126 and a peripheral portion 124 which are separately disposed on the insulating plate 123 with a gap 125 therebetween, as shown in FIGS. 4 and 5. Further, the induction heating is carried out by changing the ratio between a heat value at the central portion of the induction heating body and that at the peripheral portion thereof by applying to the induction coil 130 the two high frequency currents of different frequencies (higher frequency and lower frequency) superposedly or sequentially.

Hence, even if the temperatures of members adjacent to the susceptors 120 become lower than those of the susceptors 120, it is possible to supply heat mainly to the peripheral portions 124 of the susceptors 120 where heat is easily lost, while heating the central portions 126, by controlling the magnitudes of the currents of two frequencies applied to the induction coil 130 or the switching time of the currents alternately applied to the induction coil. As a result, the heating efficiency of the susceptors 120 can be improved, and the distribution of in-plane temperatures in the susceptors 120 can be controlled by using the skin effect of the induced current to be described below.

(Susceptor Temperature Control Using Skin Effect of Induced Current)

Hereinafter, the susceptor temperature control using the skin effect of the induced current will be described in detail. By applying a high frequency current to the induction coil 130, high frequency magnetic fluxes are generated and pass through the horizontal surface of the induction heating body 122 vertically. The induced current is induced in the peripheral surface of the induction heating body 122 by these high frequency magnetic fluxes, and the induction heating body 122 is heated by the induced current.

The skin effect of the induced current refers to the phenomenon that the induced current becomes increased at a portion closer to the peripheral portion of the conductive material and decreased exponentially as getting closer to the central portion. In accordance with the skin effect, the peripheral portion of the circular plate-shaped conductive member such as the induction heating body 122 of the present embodiment is quickly heated, whereas the central portion is hardly heated. Hence, as described above, it is possible to increase a heat value at the peripheral portion of the susceptor 120 where heat is easily lost.

The following description is related to what amount of heat can be generated at the surface of the conductive member, i.e., the peripheral and the central portion of the induction heating body 122 by the skin effect of the induced current. At this time, a current penetration depth P serves as an important index. This is because the relationship between the heat value and the distance from the peripheral portion of the induction heating body 122 is determined by the current penetration depth P. The current penetration depth P indicates a distance from the peripheral portion to a point where the intensity (magnitude) of the induced current which is decreased from the peripheral surface toward the center becomes about 1/e (≈0.368) times as much as the intensity of the induced current at the peripheral surface, as defined below:

$$P(\text{cm}) = 5.03(\rho/\mu f)^{1/2} \qquad \text{Eq. 1,}$$

where, $\rho$ indicates resistivity ($\mu\Omega\text{cm}$) of the induction heating body; $\mu$ represents relative permeability of the induction heating body ($\mu$ is 1 for a nonmagnetic body); and f denotes a frequency (Hz). Further, $\mu$ is 1 for a carbon-based material. The carbon-based material includes graphite, glassy carbon or the like.

The above Eq. 1 shows that the current penetration depth P is decreased as the frequency f is increased, and increased as the frequency f is decreased. Further, a current density $I_x$ at the distance x from the peripheral surface toward the center of the induction heating body is calculated by using the current depth P based on the following Eq. 2. Furthermore, a power density $I_x^2$ at the distance x from the peripheral surface of the induction heating body is calculated by the following Eq. 3.

$$I_x = I_o \exp(-x/P) \quad \text{Eq. 2}$$

$$I_x^2 = I_o^2 \exp(-2x/P) \quad \text{Eq. 3}$$

Figure 6:
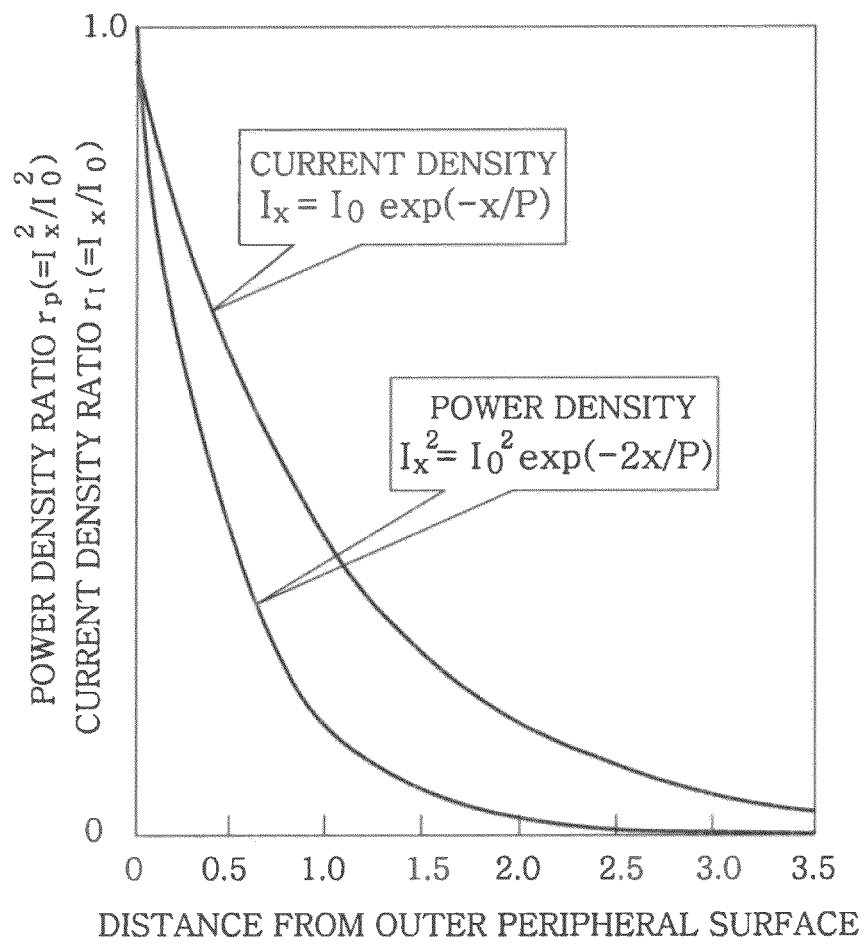
FIG. 6 is a graph showing relationships between a current density ratio and a distance (x/P) from an outer peripheral surface of an induction heating body, and between a power density ratio and the distance (x/P).

In the above Eq. 2, $I_o$ indicates a current density at the peripheral surface of the induction heating body. FIG. 6 shows relationships between a current density $I_x$ and a distance x from the peripheral surface, and a power density $I_x^2$ and the distance x. In FIG. 6, the vertical axis indicates the current density ratio $r_I = (I_x/I_o)$ and the power density ratio $r_P(I_x^2/I_o^2)$, and the horizontal axis represents x/P obtained by standardizing the distance x from the peripheral surface by P.

Referring to FIG. 6, the current density ratio $r_I(=I_x/I_o)$ is large as the distance x from the peripheral surface of the induction heating body is small and is sharply decreased as the distance x is increased in the form of a decay curve. In accordance with the Eqs. 2 and 3, the current penetration depth P is increased as the frequency is decreased, causing the current density ratio $r_I$ to be changed gradually. On the other hand, the current penetration depth P is decreased as the frequency is increased, causing the current density ratio $r_I$ to be changed sharply.

Since the current penetration depth P is increased as the frequency is decreased as described above, the peripheral portion and the central portion of the susceptor 120 may be together heated by minimizing the frequency of the high frequency current as far as possible. However, the heat value at the susceptor 120 by the induced current is in proportion to a square root of the frequency of the high frequency current. Thus, if the frequency decreases, the heating efficiency of the susceptor 120 decreases, and it is difficult to keep the heat sufficiently supplied to the peripheral portion. As a result, the distribution of in-plane temperatures in the susceptors 120 cannot be controlled.

On the other hand, the current penetration depth P is decreased as the frequency of the high frequency current is increased. Hence, only the peripheral portion of the susceptor 120 may be heated, and the in-plane uniformity in the susceptors 120 may become non-uniform.

Accordingly, the present inventors have found that it is possible to improve the heating efficiency of the susceptors 120 and control the in-plane temperatures of the susceptors 120 by separately controlling the central portion 126 and the peripheral portion 124 of the induction heating body 122 by using the high frequency currents of the lower frequency and the higher frequency. In other words, the peripheral portion 124 of the induction heating body 122 is mainly heated by the current of the higher frequency, and both of the peripheral portion 124 and the central portion 126 of the induction heating body 122 are heated by the current of the lower frequency. Thus, especially the heating efficiency of the peripheral portion of the susceptor 120 can be improved. As a result, heat can be supplied mainly to the peripheral portion where heat is easily lost due to the temperature difference between the susceptor 120 and the members adjacent thereto and, the central portion can also be heated.

As for the two high frequency currents, preferably, the lower frequency current has a frequency ranging from, e.g., about 0.5 kHz to 2 kHz, and the higher frequency current has a frequency ranging from, e.g., about 50 kHz to 200 kHz. For example, the frequency of the lower frequency current is set to about 1 kHz, and the frequency of the higher frequency current is set to about 100 kHz in the present embodiment.

In that case, the width d of the peripheral portion 124 of the induction heating body 122 shown in FIG. 5 is preferably determined based on the current penetration depth P obtained in case of applying the current of the higher frequency. Thus, when the current of the higher frequency is applied, heat can be supplied only to the peripheral portion 124. In other words, only the peripheral portion 124 of the induction heating body 122 can be heated without heating the central portion 126.

Figure 7:
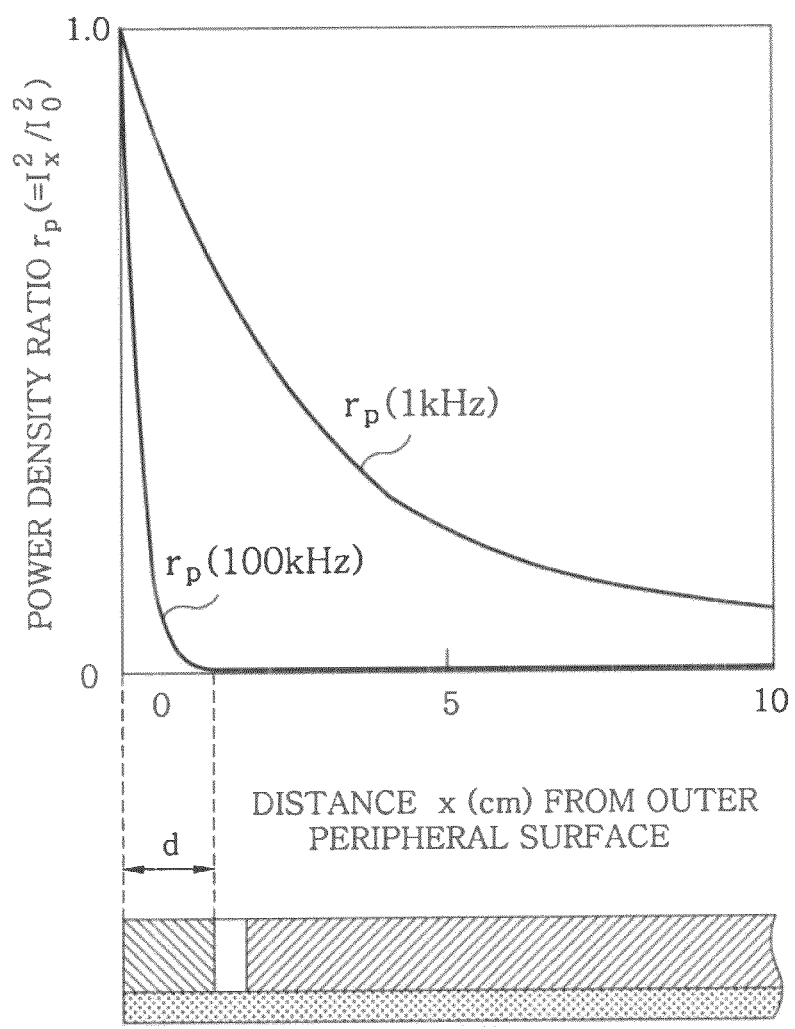
FIG. 7 sets forth a graph showing relationships between a power density ratio of a higher frequency (100 kHz) and a distance x from an outer peripheral surface of the induction heating body, and between a power density ratio of a lower frequency (1 kHz) and the distance x.

The intensity of the induced current induced in the induction heating body 122 is changed in accordance with the location of the induced current at the induction heating body 122, and the heat value at a certain location is in proportion to the density of power consumed thereat. Therefore, the distance x from the peripheral surface to the point where the power density ratio $r_P$ obtained in case of applying the current of the higher frequency (about 100 KHz in the present embodiment) becomes approximately zero is preferably set to be the width "d" of the peripheral portion 124, as shown in FIG. 7, for example.

The width "d" of the peripheral portion 124 can be calculated by the Eq. 1. To be specific, in the Eq. 1, ρ is determined by a material of the induction heating body 122, so that the relationship between the frequency "f" and the current penetration depth "P" is uniquely determined. When the induction heating body 122 is made of, e.g., graphite, ρ ranges from about 900 to 1700 μΩcm. When the induction heating body 122 is made of glassy carbon, ρ ranges from about 4000 to 16000 μΩcm. Hence, if high resistance graphite has ρ of about 1700 μΩcm, the current penetration depth P obtained in case of applying the current of the frequency of about 100 kHz is about 0.6 cm, and that obtained in case of applying the current of the frequency of about 1 kHz is about 6 cm.

Referring to FIG. 6, the power density ratio $r_P$ becomes approximately zero when the current penetration depth P is increased by about 2.5 times. For example, the current penetration depth P obtained in case of applying the current of the frequency of about 100 kHz is about 0.6 cm, so that the heat value becomes about zero when the current penetration depth P is about 1.5 cm which is increased by about 2.5 times. Moreover, the current penetration depth P obtained in case of applying the current of the frequency of about 1 kHz is about 6 cm, so that the heat value becomes about zero when the current penetration depth P is about 15 cm which is increased by about 2.5 times.

Thus, if the width "d" of the peripheral portion 124 is set to be about 1.5 cm, when the current of the higher frequency of about 100 kHz is applied, the heat can be supplied only to the peripheral portion 124. As a consequence, only the peripheral portion 124 can be heated without heating the central portion 126. Furthermore, when the current of the lower frequency of about 1 kHz is applied, the central portion 126 as well as the peripheral portion 124 can be heated. In that case, the peripheral portion 124 and the central portion 126 are separated and thus are heated independently.

Figure 8:
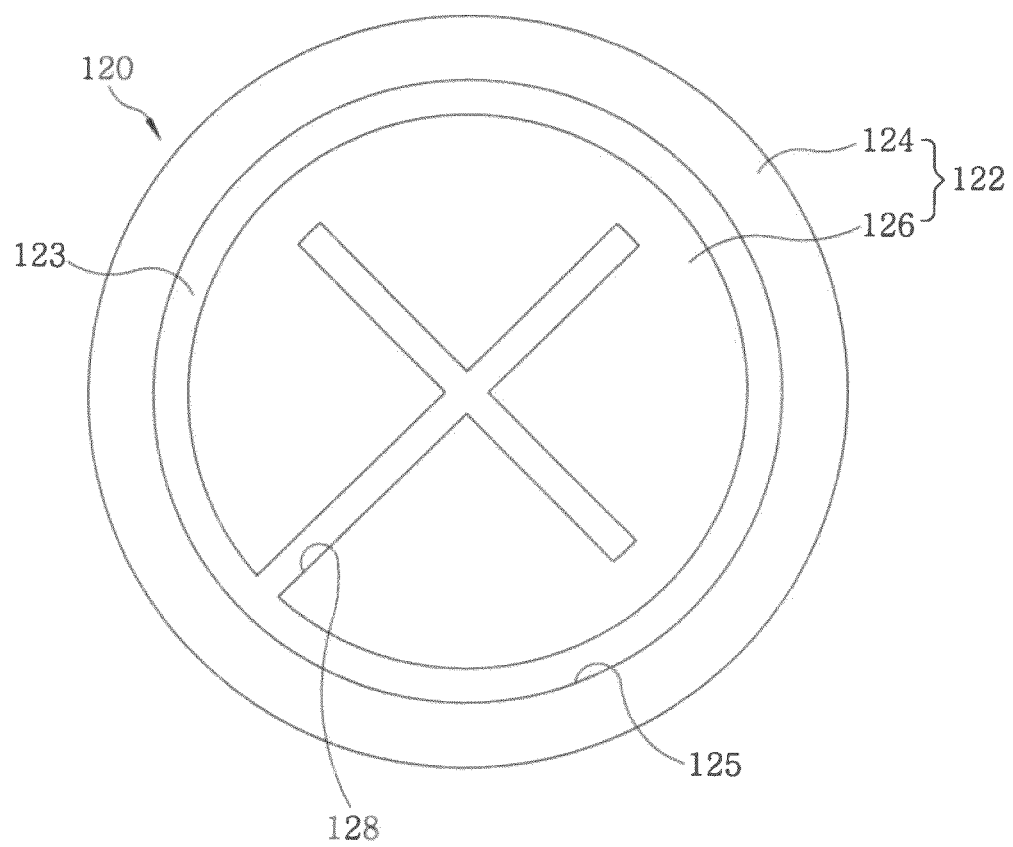
FIG. 8 illustrates a top view showing another configuration example of the susceptor of the present embodiment.

The configuration of the susceptor 120 is not limited to that shown in FIGS. 4 and 5. As can be seen from FIG. 8, for example, a groove 128 may be formed at the central portion 126 of the induction heating body 122 so as to control the flow of the induced current induced therein. The groove 128 extends from the peripheral surface of the central portion 126 toward at least the center thereof. For example, the groove 128 is formed in a cross shape having one end extending to the peripheral portion, as illustrated in FIG. 8.

Therefore, the induced current induced in the central portion 126 flows along the groove 128 toward the center of the central portion 126 and circulates through the groove 128. Then, the induced current flows toward the peripheral portion. Accordingly, since the induced current flows at the center of the central portion 126, the heat is generated therein, which results in making more uniform in-plane temperature in the central portion 126. The shape of the groove 128 is not limited to that shown in FIG. 8.

Figure 9:
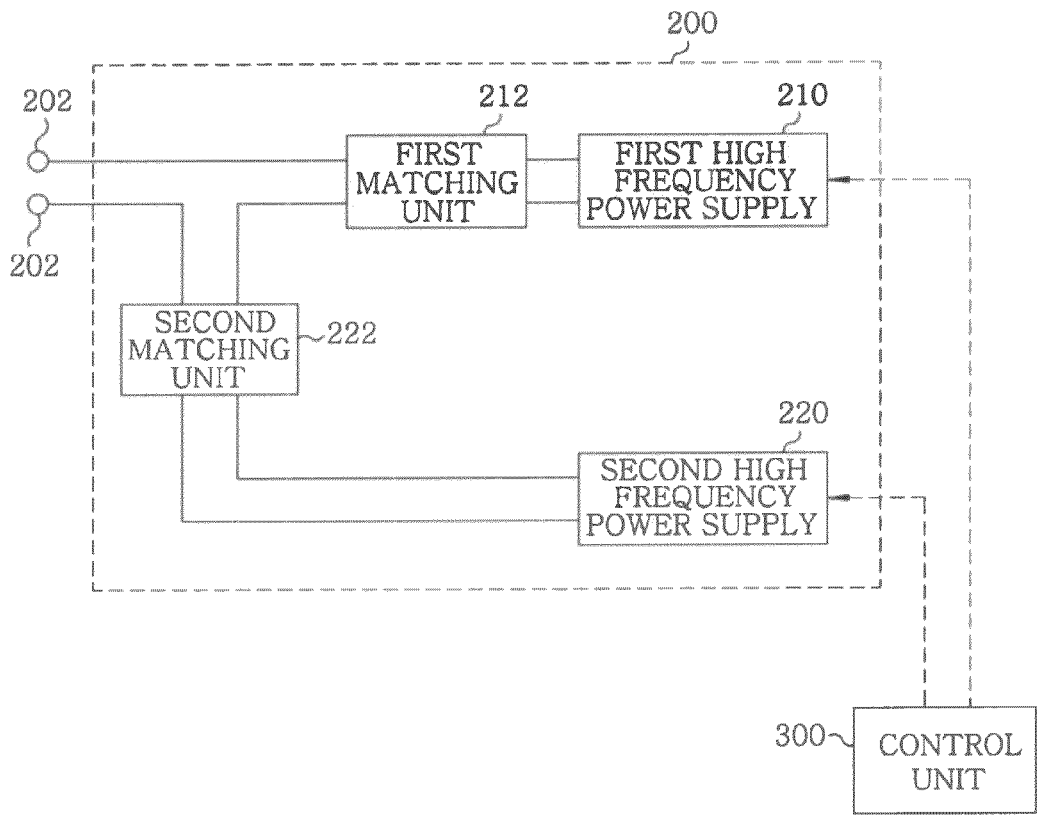
FIG. 9 provides a block diagram showing a configuration example of a high frequency current circuit of the present embodiment.

The high frequency currents of the two frequencies may be applied superposedly or sequentially. A specific configuration example of the high frequency current circuit 200 capable of performing such application control is shown in FIG. 9. FIG. 9 is a block diagram showing a schematic configuration of the high frequency current circuit 200 of the present embodiment.

The high frequency current circuit 200 shown in FIG. 9 includes a first high frequency power supply 210 for outputting a high frequency current of a first frequency $f_1$ (about 1 kHz in the present embodiment) and a second high frequency power supply 220 for outputting a high frequency current of a second frequency $f_2$ (about 100 kHz in the present embodiment). The output of the first high frequency power supply 210 is connected to an outer terminal 202 of the high frequency current circuit 200 via the first matching circuit 212. The first matching circuit 212 has, e.g., a transformer provided between the output of the high frequency current circuit 200 and the input of the first matching circuit 212 and the like.

The output of the second high frequency power supply 220 is connected between the first matching circuit 212 and the other output terminal 202 via the second matching circuit 222. The second matching circuit 222 has, e.g., a transformer provided between the output of the second high frequency current circuit 220 and the output of the first matching circuit 212, and serves to superpose the output from the first high frequency power supply 210 and the output from the second high frequency power supply 220.

The first and the second high frequency power supply 210 and 220 are connected to the control unit 300, and the output of each of the high frequency power supplies 210 and 220 can be switched on and off by the control signal from the control unit 300. Accordingly, it is possible to heat only the peripheral portion 124 or both of the peripheral portion 124 and the central portion 126 by applying the current of the lower first frequency $f_1$ and the current of the higher second frequency $f_2$ to the induction coil 130 superposedly or sequentially in accordance with the control signals outputted from the control unit 300.

Figure 10:
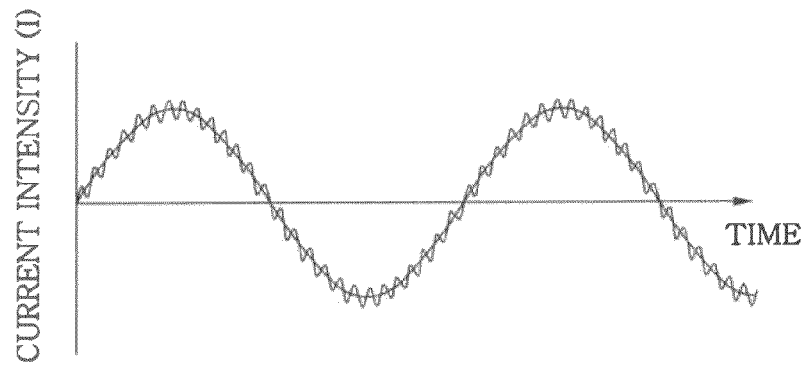
FIG. 10 depicts a specific example of a current waveform obtained by superposing a high frequency current of a lower frequency (1 kHz) and that of a higher frequency (100 kHz).

For example, the waveform, e.g., the current waveform shown in FIG. 10, of the high frequency current obtained by superposing (overlapping) the current of the first frequency $f_1$ and the current of the second frequency $f_2$ can be outputted to the output terminal 202 of the high frequency current circuit 200 by switching on the current output of the first frequency $f_1$ of the first high frequency power supply 210 and the current output of the second frequency $f_2$ of the second high frequency power supply 220 based on the control signals from the control unit 300. In that case, the heat value at the peripheral portion 124 and that at the central portion 126 can be controlled by controlling the intensity (magnitude) ratio of the high frequency current of the first to that of the second frequency. Further, only the peripheral portion 124 can be heated by switching off the current output of the first frequency $f_1$.

As described above, the heat value in the induction heating body 122 is in proportion to a square root of the frequency of the high frequency current applied to the induction coil 130. Since the heat value decreases as the frequency decreases, the heat value of the entire induction heating body 122 can be increased by increasing the current of the lower frequency. On the other hand, the heat value increases as the frequency of the high frequency current applied to the induction coil 130 increases. Accordingly, the balance of the heat value in the entire induction heating body 122 can be controlled by relatively decreasing the current of the higher frequency.

In addition, the ratio between the heat value at the peripheral portion 124 of the induction heating body 122 and that at the central portion 126 can be controlled by controlling the intensity ratio of the currents of the higher frequency and the lower frequency.

For example, the ratio between the heat value at the peripheral portion 124 of the induction heating body 122 and that at the central portion 126 can be controlled by superposedly applying the current of the first frequency $f_1$ (1 kHz) and the current of the second frequency $f_2$ (100 kHz) to the induction coil 130 and controlling the intensity ratio of the currents (intensity of the current of the first frequency $f_1$ (1 kHz)/ intensity of the current of the second frequency $f_2$ (100 kHz)).

Figure 11A:
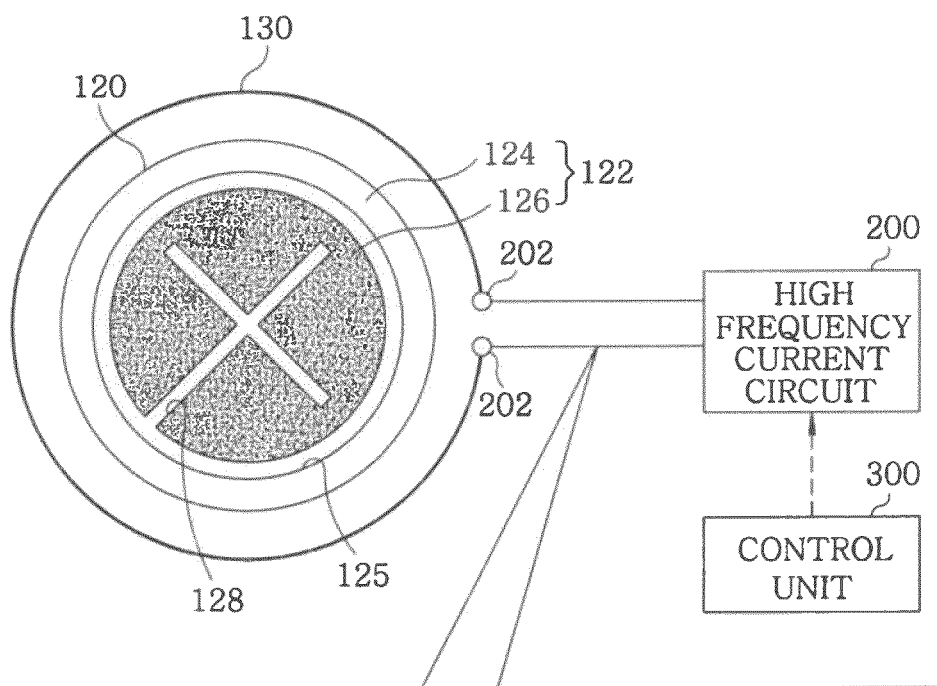
FIG. 11A conceptually shows an in-plane temperature distribution in the susceptor when a lower frequency current (1 kHz) and a higher frequency current (100 kHz) are overlapped and the intensity ratio of the lower frequency current to the higher frequency current is increased.
Figure 11A:
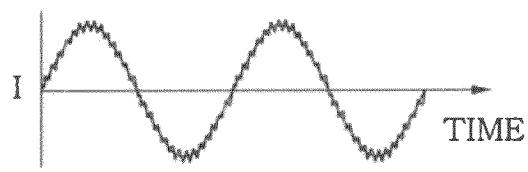

In that case, as the intensity ratio of the currents being increased, the heat value at the peripheral portion 124 is decreased and the heat value at the central portion 126 can be increased. Hence, the central portion 126 can be heated more than the peripheral portion 124, as shown in FIG. 11A, for example. In FIG. 11A, a heat generating portion, or a portion having a larger heat value between the peripheral portion 124 and the central portion 126, is indicated by shades (this is true in FIGS. 11B, 13A and 13B).

Figure 11B:
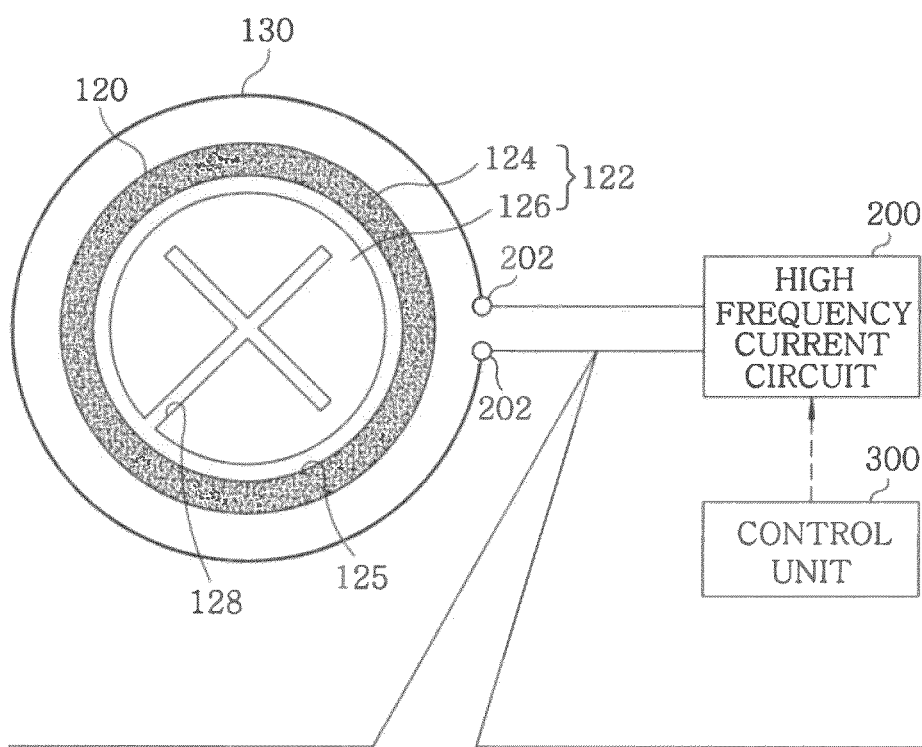
FIG. 11B conceptually illustrates an in-plane temperature distribution in the susceptor when a lower frequency current (1 kHz) and a higher frequency current (100 kHz) are overlapped and the intensity ratio of the lower frequency current to the higher frequency current is decreased.
Figure 11B:
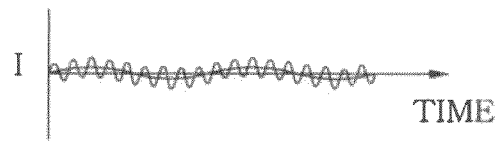

On the other hand, as the intensity ratio of the currents is getting decreased, the heat value at the peripheral portion 124 is increased and the heat value at the central portion 126 is decreased. Therefore, only the peripheral portion 124 can be heated as shown in FIG. 11B, for example. Moreover, the heat value of the entire induction heating body 122 can be balanced by increasing the currents of the higher frequency and the lower frequency while maintaining the intensity ratio of the currents. As a result, it is possible to raise the overall temperature of the susceptor 120 while maintaining the temperature distribution in the susceptor 120.

Besides, only the high frequency current of the first frequency $f_1$ can be outputted to the output terminal 202 of the high frequency current circuit 200 by switching on the current output of the first frequency $f_1$ of the first high frequency power supply 210 and switching off the current output of the second frequency $f_2$ of the second high frequency power supply 220 based on the control signals from the control unit 300. On the contrary, only the high frequency current of the second frequency $f_2$ can be outputted to the output terminal 202 of the high frequency current circuit 200 by switching off the current output of the first frequency $f_1$ of the first high frequency power supply 210 and switching on the current output of the second frequency $f_2$ of the second high frequency power supply 220.

Figure 12:
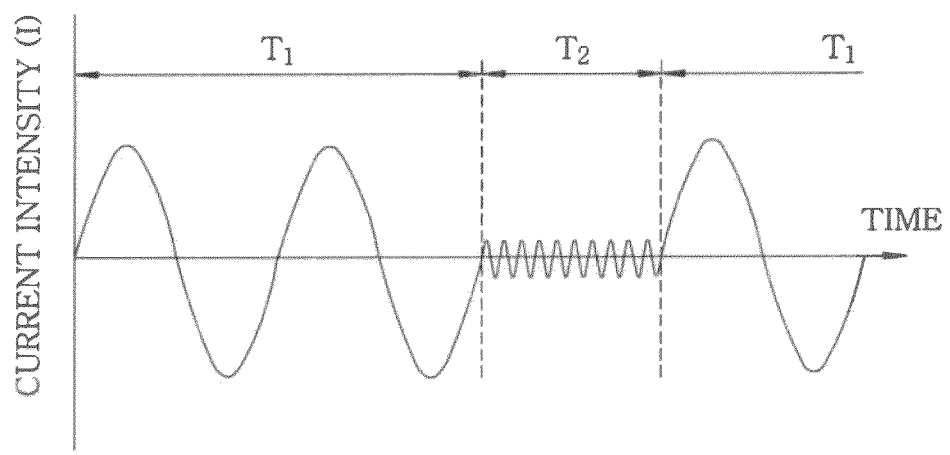
FIG. 12 depicts a specific example of a current waveform obtained by alternately applying the higher frequency current of the lower frequency (1 kHz) and that of the higher frequency (100 kHz) sequentially.

Therefore, the current waveform shown in FIG. 12 can be obtained by sequentially applying the high frequency currents of the first frequency $f_1$ (1 kHz) and the second frequency $f_2$ (100 kHz) to the induction coil 130. For example, the current waveform in a time period $T_1$ shown in FIG. 12 is obtained by the current of the first frequency $f_1$ (1 kHz), and the current waveform in a time period $T_2$ shown in FIG. 12 is obtained by the current of the second frequency $f_2$ (100 kHz). In that case, the heat value at the peripheral portion 124 of the induction heating body 122 and that at the central portion 126 thereof can be controlled by controlling the application time $T_1$ of the current of the first frequency $f_1$ (1 kHz) and the application time $T_2$ of the second frequency $f_2$ (100 kHz).

Figure 13A:
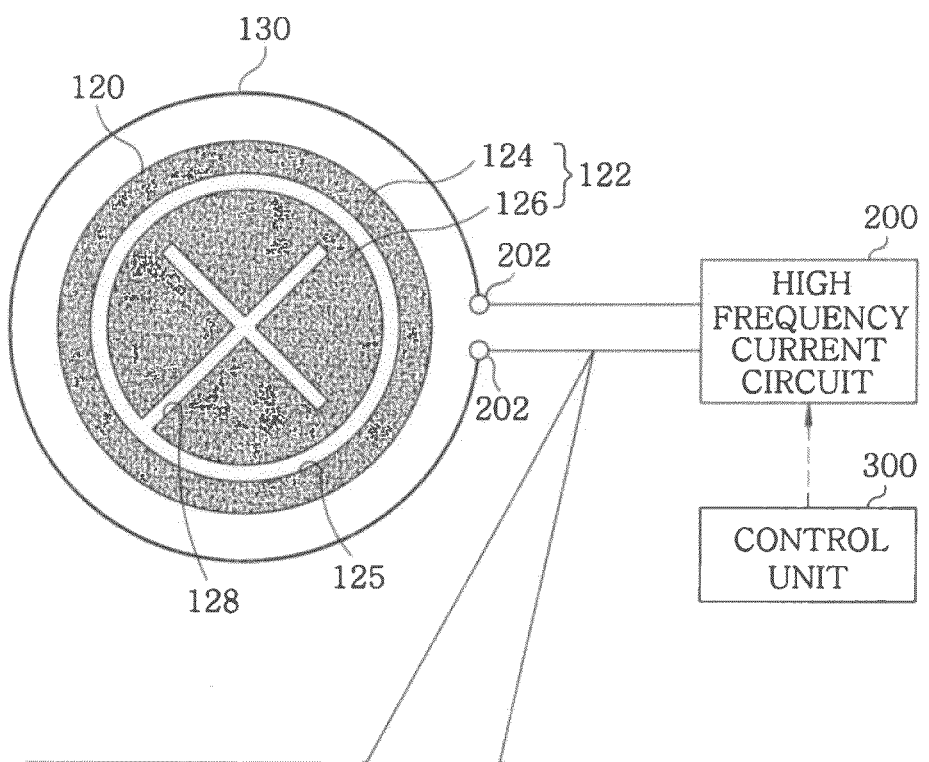
FIG. 13A conceptually shows an in-plane temperature distribution in the susceptor while the higher frequency current of the lower frequency is applied.
Figure 13A:
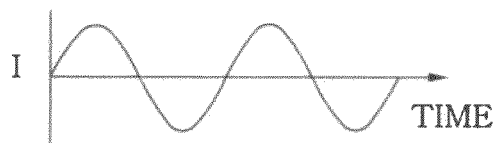
Figure 13B:
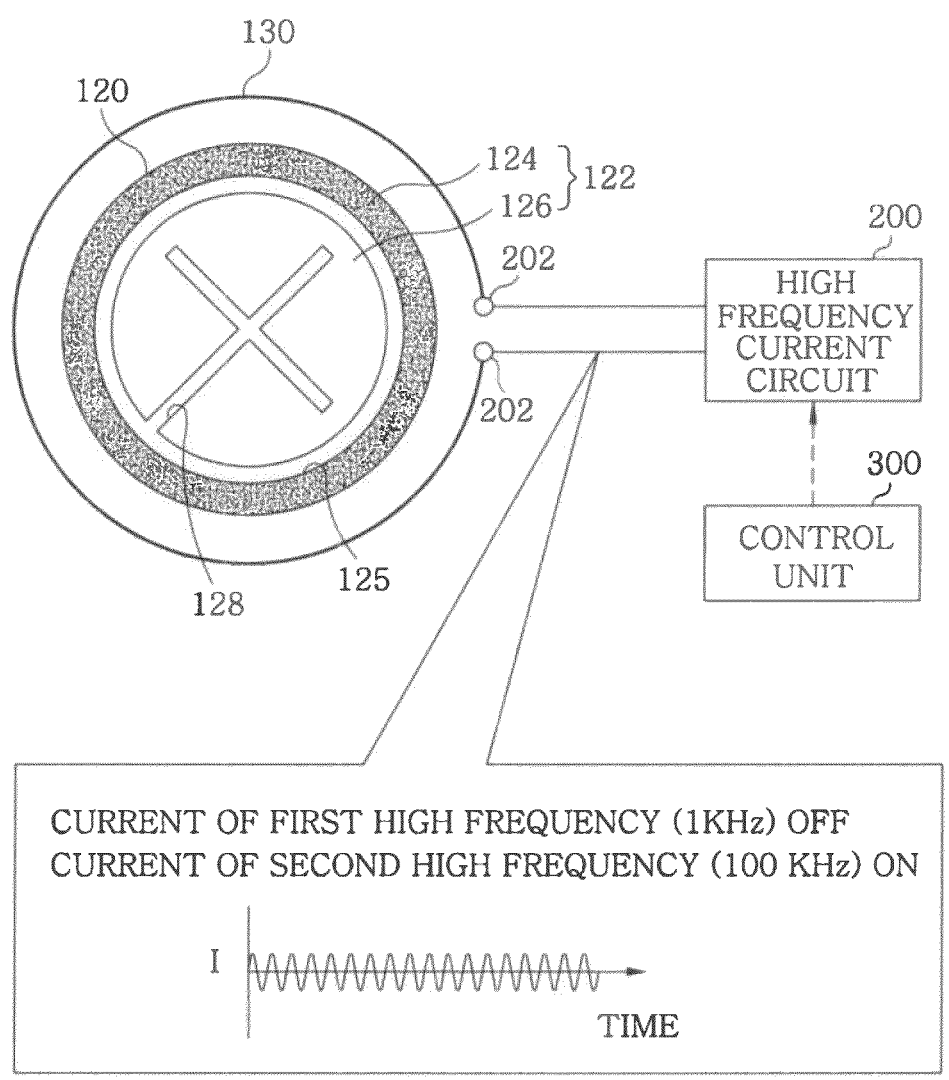
FIG. 13B conceptually describes an in-plane temperature distribution in the susceptor while the higher frequency current of the higher frequency is applied.

For example, during the time period $T_1$ in which only the current of the first frequency $f_1$ (1 kHz) is applied, the central portion 126 can be heated more than the peripheral portion 124, as can be seen from FIG. 13A. On the other hand, during the time period $T_2$ in which only the current of the second frequency $f_2$ (100 kHz) is applied, only the peripheral potion 124 can be heated, as shown in FIG. 13B Moreover, the configuration of the high frequency current circuit 200 is not limited to that shown in FIG. 9. For example, when the high frequency currents of two frequencies are applied superposedly, the first high frequency power supply 210 and the second high frequency power supply 220 may be connected in series. When the high frequency currents of two frequencies are applied alternately in a time series, the first high frequency power supply 210 and the second high frequency power supply 220 may be switchably configured.

As described above, in accordance with the high frequency current circuit 200, the ratio between the heat value at the peripheral portion of the induction heating body and that at the central portion thereof can be controlled by applying the current of the first higher frequency $f_1$ and the current of the second lower frequency $f_2$ to the induction coil 130 superposedly or sequentially. Thus, only the peripheral portion 124 can be heated, or both of the peripheral portion 124 and the central portion 126 can be heated.

Accordingly, the in-plane temperature distribution in the susceptor 120 can be controlled and, further, the in-plane temperature distribution of the wafer W can be controlled. Especially, when the sidewall of the reaction tube 104 (sidewall of the processing chamber 102) is made of a metal and controlled to be maintained at a low temperature as in the heat treatment apparatus 100 of the present embodiment, heat is easily lost from the peripheral portion and, thus, such effect is extremely advantageous in that it is possible to supply heat mainly to the peripheral portion while heating the central portion.

While the invention has been shown and described with respect to the embodiments, it will be understood by those skilled in the art that various changes and modification may be made without departing from the scope of the invention as defined in the following claims.

The present invention can be applied to a substrate processing chamber for performing predetermined processing on a substrate, e.g., a semiconductor wafer, a glass substrate or the like.

What is claimed is:

1. A heat treatment apparatus for performing a heat treatment on a plurality of substrates by supplying a gas into a depressurizable processing chamber having a sidewall made of aluminum or an aluminum alloy, the heat treatment apparatus comprising:
   a plurality of susceptors having conductive members for mounting the substrates thereon, each of the susceptors having an induction heating body divided into a central portion and a peripheral portion;
   a susceptor supporting unit for supporting the susceptors, which are spaced apart from each other at a regular interval in a row;
   an induction coil which is arranged inside the processing chamber to surround a circumference of each of the susceptors, a temperature of the induction coil being controllable, and wherein, for the induction heating body of each of the plurality of susceptors, the central portion of the induction heating body is farther away from the induction coil than the peripheral portion of the induction heating body is from the induction coil;
   a high frequency current circuit for applying two high frequency currents of different frequencies to the induction coil;
   a control unit configured to perform temperature control by changing a ratio between a heat value at the central portion of the induction heating body and a heat value at the peripheral portion thereof by controlling the two high frequency currents of different frequencies to be applied at the same time as a superposition of the two high frequency current, and
   a wall temperature control mechanism for controlling a temperature of the sidewall independently of temperature of the plurality of susceptors.

2. The heat treatment apparatus of claim 1, wherein the control unit performs the temperature control by applying the two high frequency currents of different frequencies sequentially or as a superposition of the two high frequency currents from the high frequency current circuit to the induction coil.

3. The heat treatment apparatus of claim 2, wherein the control unit is configured to apply the two high frequency currents sequentially and to change the ratio of the heat value at the central portion to the heat value at the peripheral portion of the induction heating body by changing a ratio of a switched-on time of a first of the two high frequency currents to a switched-on time of a second of the two high frequency currents.

4. The heat treatment apparatus of claim 1, wherein the temperature of the sidewall of the processing chamber is set to be lower than the temperatures of the susceptors.

5. The heat treatment apparatus of claim 4, wherein the induction coil is formed as a metal pipe, and the apparatus further comprises a coil temperature control mechanism for controlling the temperature of the induction coil by circulating a temperature control medium in the metal pipe.

6. The heat treatment apparatus of claim 5, wherein the temperature of the induction coil is set to be equal to the temperature of the sidewall of the processing chamber.

7. The heat treatment apparatus of claim 1, wherein one of the two frequencies is set within a range from about 0.5 kHz to 2 kHz and the other is set within a range from about 50 kHz to 200 kHz by the high frequency current circuit.

8. The heat treatment apparatus of claim 7, wherein a relatively higher frequency of the two frequencies and a width of the peripheral portion of the induction heating body are set to inductively heat only the peripheral portion of the induction heating body by the current having the relatively higher frequency.

9. The heat treatment apparatus of claim 1, wherein a groove is formed at the central portion of the induction heating body that extends from an edge thereof toward a center thereof.

10. The heat treatment apparatus of claim 1, wherein the induction heating body is made of one or more materials selected from among graphite, glassy carbon and SiC.

11. The heat treatment apparatus of claim 1, wherein a resistivity of a material of a sidewall of the processing chamber is lower than that of a material of the induction heating body.

12. The heat treatment apparatus of claim 1, wherein the control unit is configured to apply two high frequency currents of different current intensities.

13. The heat treatment apparatus of claim 1, wherein the control unit is configured to increase the ratio of the heat value at the central portion to the heat value at the peripheral portion of the induction heating body by increasing a ratio of a current intensity of a first of the two high frequency currents to a current intensity of a second of the two high frequency currents, the first of the two high frequency currents having a lower frequency than the second of the two high frequency currents.

14. The heat treatment apparatus of claim 1, wherein the control unit is configured to decrease the ratio of the heat value at the central portion to the heat value at the peripheral portion of the induction heating body by decreasing a ratio of a current intensity of a first of the two high frequency currents to a current intensity of a second of the two high frequency currents, the first of the two high frequency currents having a lower frequency than the second of the two high frequency currents.

\* \* \* \* \*